(12) United States Patent
Lin et al.

(10) Patent No.: US 7,658,627 B2
(45) Date of Patent: Feb. 9, 2010

(54) ELECTRICAL CONNECTOR ASSEMBLY WITH PICK-UP CAP

(75) Inventors: Nan-Hung Lin, Tu-Cheng (TW); Shuo-Hsiu Hsu, Tu-Cheng (TW); Jia-Hau Liu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/485,075

(22) Filed: Jun. 16, 2009

(65) Prior Publication Data

US 2009/0311882 A1    Dec. 17, 2009

(30) Foreign Application Priority Data

Jun. 16, 2008  (CN) .................................. 09 7 21061

(51) Int. Cl.
*H01R 13/44*    (2006.01)
(52) U.S. Cl. ..................................................... 439/135
(58) Field of Classification Search ................. 439/135, 439/940

See application file for complete search history.

(56) References Cited

U.S. PATENT DOCUMENTS

| | | | | |
|---|---|---|---|---|
| 5,688,133 A | * | 11/1997 | Ikesugi et al. | 439/135 |
| 6,753,474 B2 | * | 6/2004 | Trout | 174/66 |
| 7,530,822 B2 | | 5/2009 | Liao | |
| 7,534,114 B2 | * | 5/2009 | Liao | 439/135 |
| 7,575,449 B1 | * | 8/2009 | Cai | 439/135 |
| 2009/0061652 A1 | * | 3/2009 | Fan | 439/41 |

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

An electrical connector assembly includes an electrical connector with an insulative housing and a pick-up cap assembled to the electrical connector. The insulative housing defines a substantially rectangular cavity in middle thereof and a number of contacts received in the cavity. The pick-up cap includes a main portion with a planar top surface and a plurality of spring arms extending from opposite edges of the main portion for engaging with the electrical connector. Each spring arm has a locking portion for engaging with the main portion if excessive deformation of the spring arm is encountered.

5 Claims, 5 Drawing Sheets

ELECTRICAL CONNECTOR ASSEMBLY WITH PICK-UP CAP

BACKGROUND OF THE INVENTION

1. Field of the Invention

The present invention relates to an electrical connector assembly which comprises an electrical connector and a pick-up cap, which is mounted onto the electrical connector for providing a planar top surface to be engaged by a vacuum suction device, whereby the electrical connector assembly can be placing onto a circuit substance such as a printed circuit board (PCB) on which the connector is mounted.

2. Description of the Prior Art

U.S. Pat. No. 7,530,822 issued to Liao on May 12, 2009 discloses an electrical connector assembly with a pick-up cap mounted to an insulative housing of the electrical connector assembly. The pick-up cap includes a body portion having four edges. Each edge of the body portion has a pair of latching sections extending horizontally along corresponding edge thereof and then extending downwardly. The insulative housing defines four pairs of recesses to engage with the latching sections. When the pick-up cap is assembled to the insulative housing by an operator, the latching sections of the pick-up cap move outwardly and slide downwardly into the recesses of the insulative housing. The operator sometimes may make mistake, such as exerting an excessive force to the pick-up cap, during assembling the pick-up cap to the insulative housing. That results in deflection or damage of the latching sections.

Therefore, it is need to find a new electrical connector assembly having an improved pick-up cap to overcome the problems mentioned above.

SUMMARY OF THE INVENTION

Accordingly, an object of the present invention is to provide an electrical connector assembly with a pick-up cap having a stopper element for protecting the pick-up cap from breaking resulted from over-stroke.

In order to achieve the object set forth, an electrical connector assembly, comprises an electrical connector with an insulative housing and a pick-up cap assembled to the electrical connector. The insulative housing defines a substantially rectangular cavity in middle thereof and a plurality of contacts received in the cavity. The pick-up cap comprises a main portion with a planar top surface. The main portion comprises a plurality of spring arms extending from two opposite edges of the main portion for engaging with the electrical connector. Each spring arm has a locking portion disposed within the top surface for engaging with the main portion in case an over-stroke of the spring arms is encountered.

In order to further achieve the object set forth, an electrical connector assembly, comprises an electrical connector and a pick-up cap assembled to the electrical connector. The insulative housing defines a base and a plurality of periphery walls extending from the base. The pick-up cap comprises a main portion with a planar top surface. The main portion comprises a plurality of spring arms extending from edges of the main portion. Each spring arm has a locking portion limited by a recess defined on the main portion to prevent the spring arm from over expanding.

DESCRIPTION OF PREFERRED EMBODIMENT

Reference will now be made to the drawings to describe the present invention in detail.

Figure 1:
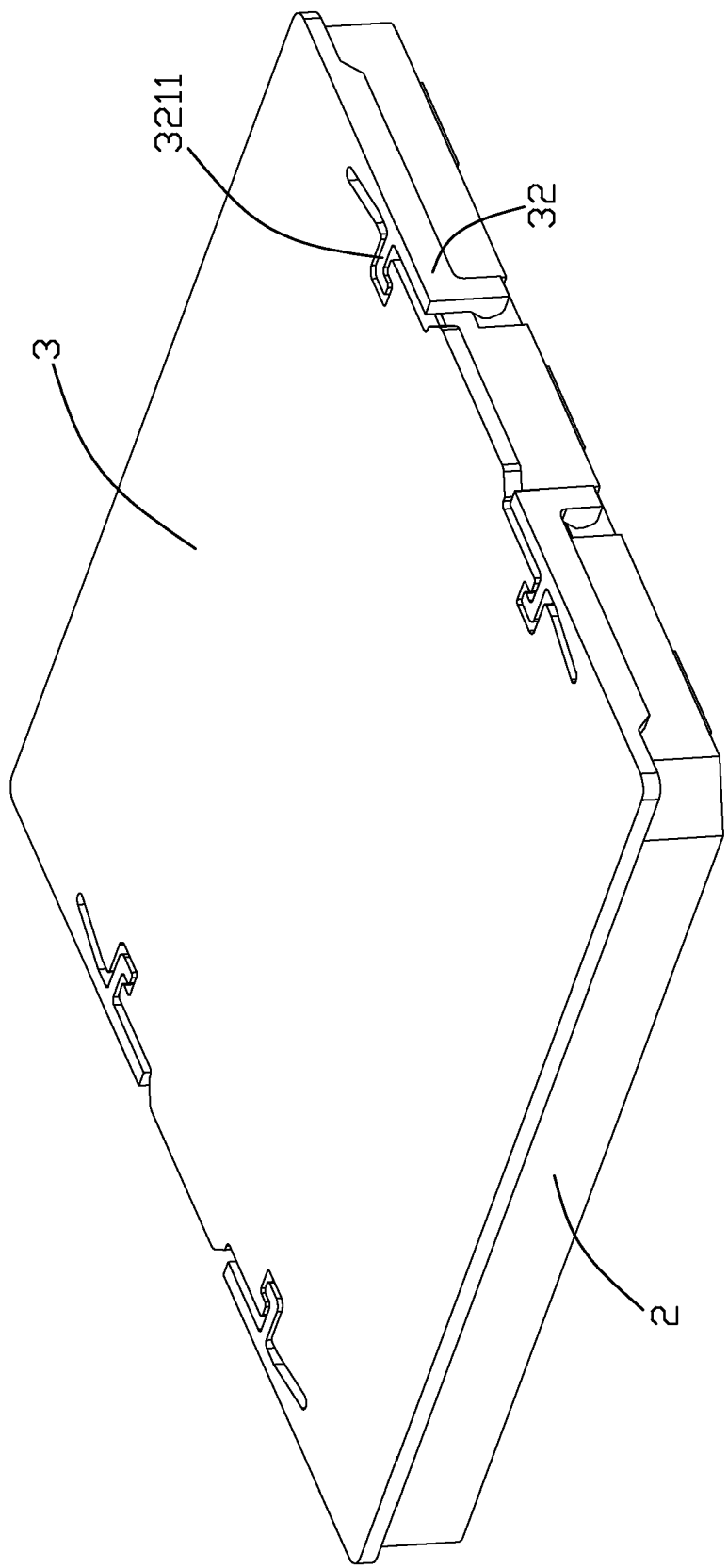
FIG. 1 is an assembled perspective view of an electrical connector assembly according to the present invention.
Figure 2:
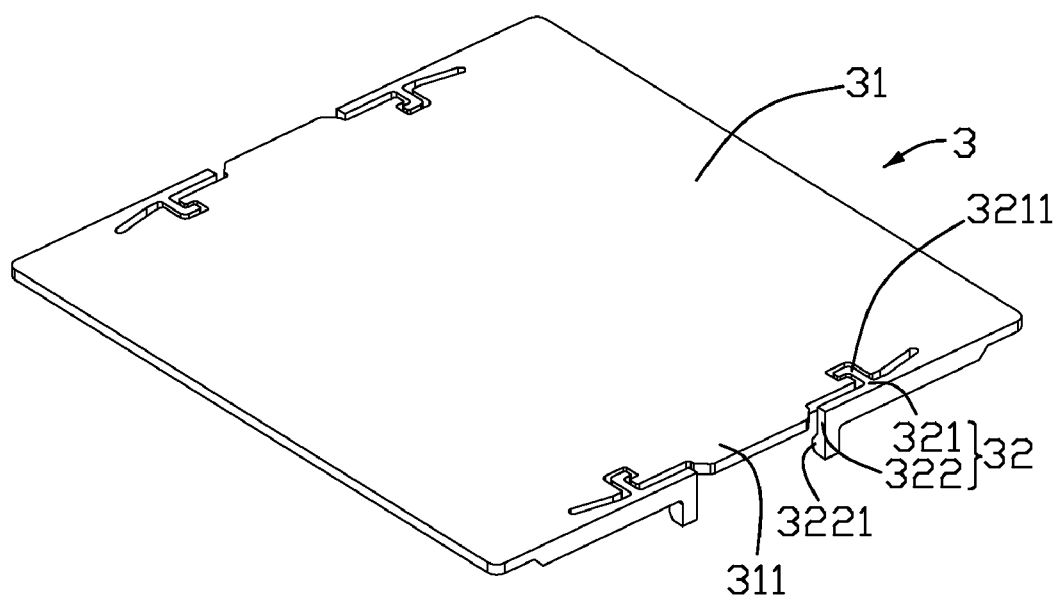
FIG. 2 is an exploded perspective view of the electrical connector assembly of FIG. 1.
Figure 2:
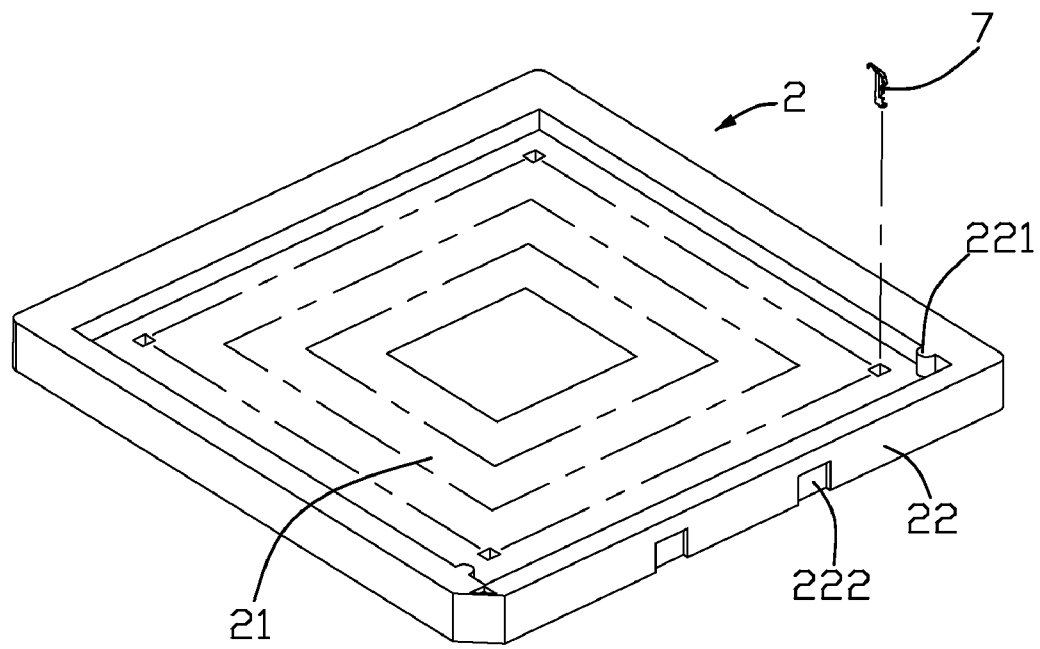

FIG. 1 and FIG. 2 show an electrical connector assembly for electrically connecting a printed circuit board (not shown) to an electronic package (not shown). The electrical connector assembly comprises an electrical connector and a pick-up cap 3 assembled to the electrical connector.

The electrical connector includes an insulative housing 2 and a plurality of contacts 7 received in the insulative housing 2. The insulative housing 2 is formed with a rectangular configuration and molded from resin or the like. The insulative housing 2 comprises a base 21 and a plurality of periphery walls 22 extending upwardly from the base 21. The base 21 and the periphery walls 22 define a cavity 23 to receive the electronic package (not shown). The base 21 defines a plurality of passageways (not shown) for receiving the contacts 7. A pair of posts 221 are disposed on inside walls of the periphery walls 22 and located at opposite sides of the cavity 23 for correctly orientating the electronic package. A plurality of recesses 222 are disposed on outside walls of the periphery walls 22.

The pick-up cap 3 is mounted to the insulative housing 2 and is substantially rectangular. The pick-up cap 3 includes a main portion 31 with a planar top surface engaged picked up by a vacuum nozzle (not shown) for disposing the electrical connector assembly onto the printed circuit board (not shown). The main portion 31 has a pair of handles 311 at opposite edges thereof for conveniently removing the pick-up cap 3 from the electrical connector. A pair of spring arms 32 are disposed at opposite sides of the handle 311 and extend from the main portion 31 toward the handle 311. Each spring arm 32 extends along corresponding edge of the main portion 31, a slot is defined between the spring arm 32 and the main portion 31. The spring arm 32 includes a horizontal lateral portion 321 and a latch portion 322 extending downwardly and vertically from the lateral portion 321. A protrusion 3221 extends from a free end of the latch portion 322 toward the main portion 31 to engage with the recess 222 of the insulative housing 2 to assemble the pick-up cap 3 to the insulative housing 2. An L-shaped locking portion 3211 extends from a middle of the lateral portion 321 of the main portion 31, the main portion 31 has an L-shaped locking recess 312 corresponding to the locking portion 3211 and engaging with the locking portion 3211 to protect the spring arm 32 from breaking when the spring arm 32 over expanding outwardly.

Figure 3:
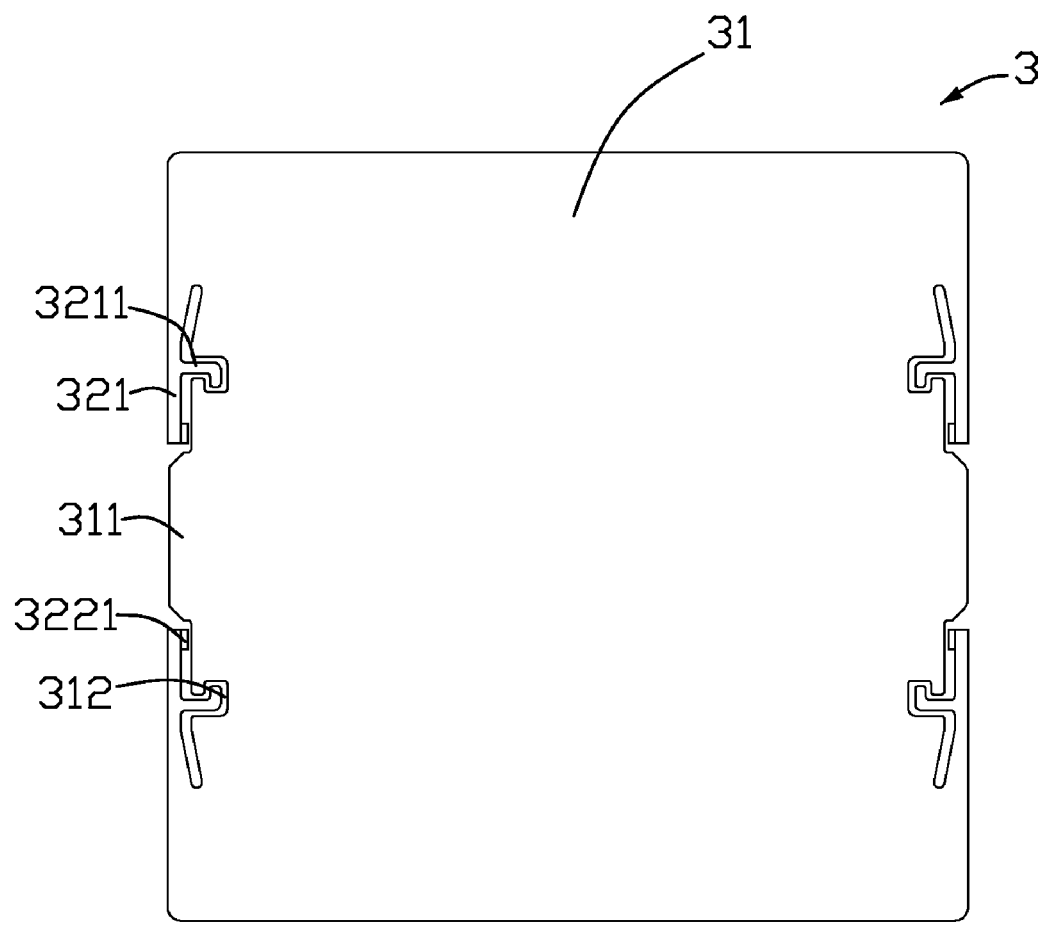
FIG. 3 is a top view of a pick-up cap of the electrical connector assembly of FIG. 2.

Referencing to FIG. 3, when the pick-up cap 3 is at a normal situation, it means that there is no force exerting on the pick-up cap 3, an outer surface of the spring arm 32 and the outer surface of the main portion 31 are at a common line. The lateral portion 321 has two parts disposed on two sides of the locking portion 3211, a part extending from the main portion 31 has a gradually enhancive width to make a linking portion of the part with the main portion 31 has a large width than the rest part thereof, so the lateral portion 321 will not be easily break off.

Figure 4:
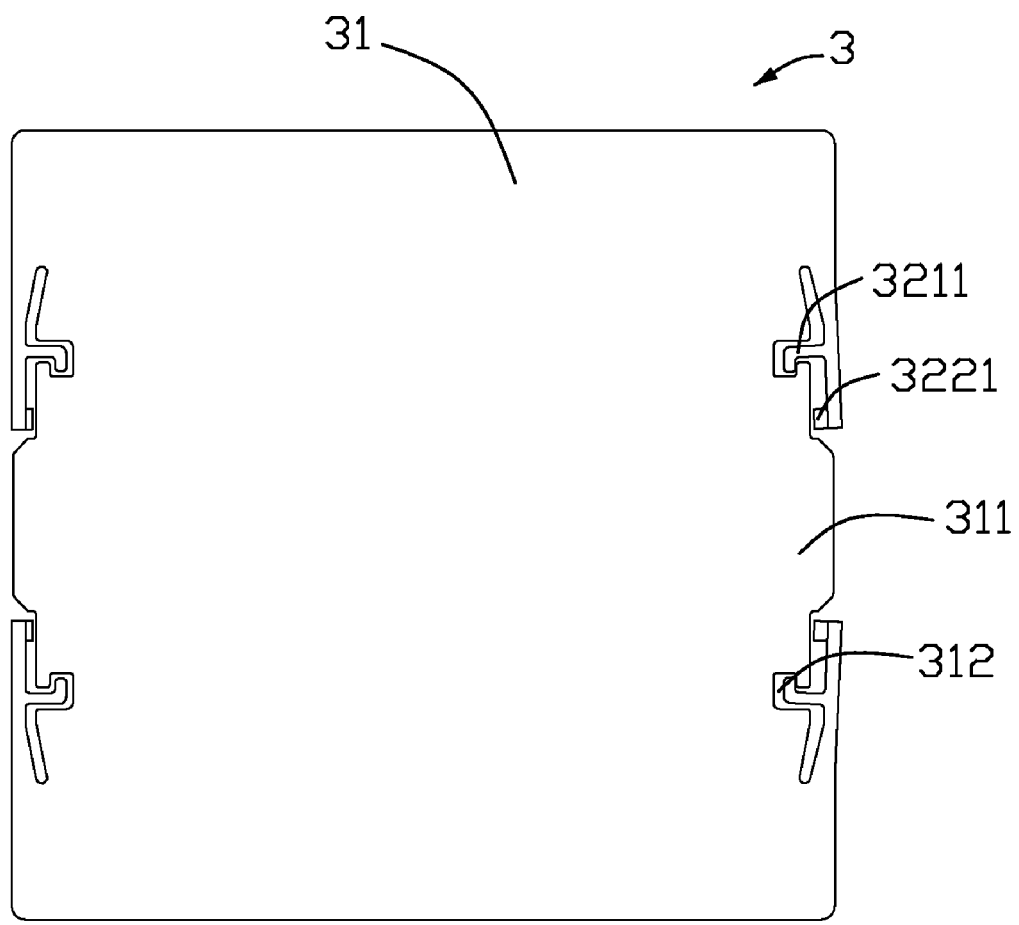
FIG. 4 is a top view of the pick-up cap of FIG. 3, showing the pick-up cap deformed by an exterior force.

When the pick-up cap 3 is assembled to the insulative housing 2, the latching portions 322 are seat on the outer surface of the periphery walls 22 of the insulative housing 2. Then the spring arms 32 expands outwardly and moves downwardly by exerting a downward exterior force to the pick-up cap 3, thereby the protrusions 3221 are received in the recesses 222 of the insulative housing 2. In the above described process, there may be mistakes making by an operator, such as exerting an excessive force to the pick-up cap 3 or other incorrect handling, to deform or break the spring arm 32. Referring to FIG. 4, in the present invention, the locking recesses 312 can prevent the locking portions 3211 from over expanding outwardly during the spring arms 32 moving, thereby to avoid damage to the spring arms 32 as misuse.

Figure 5:
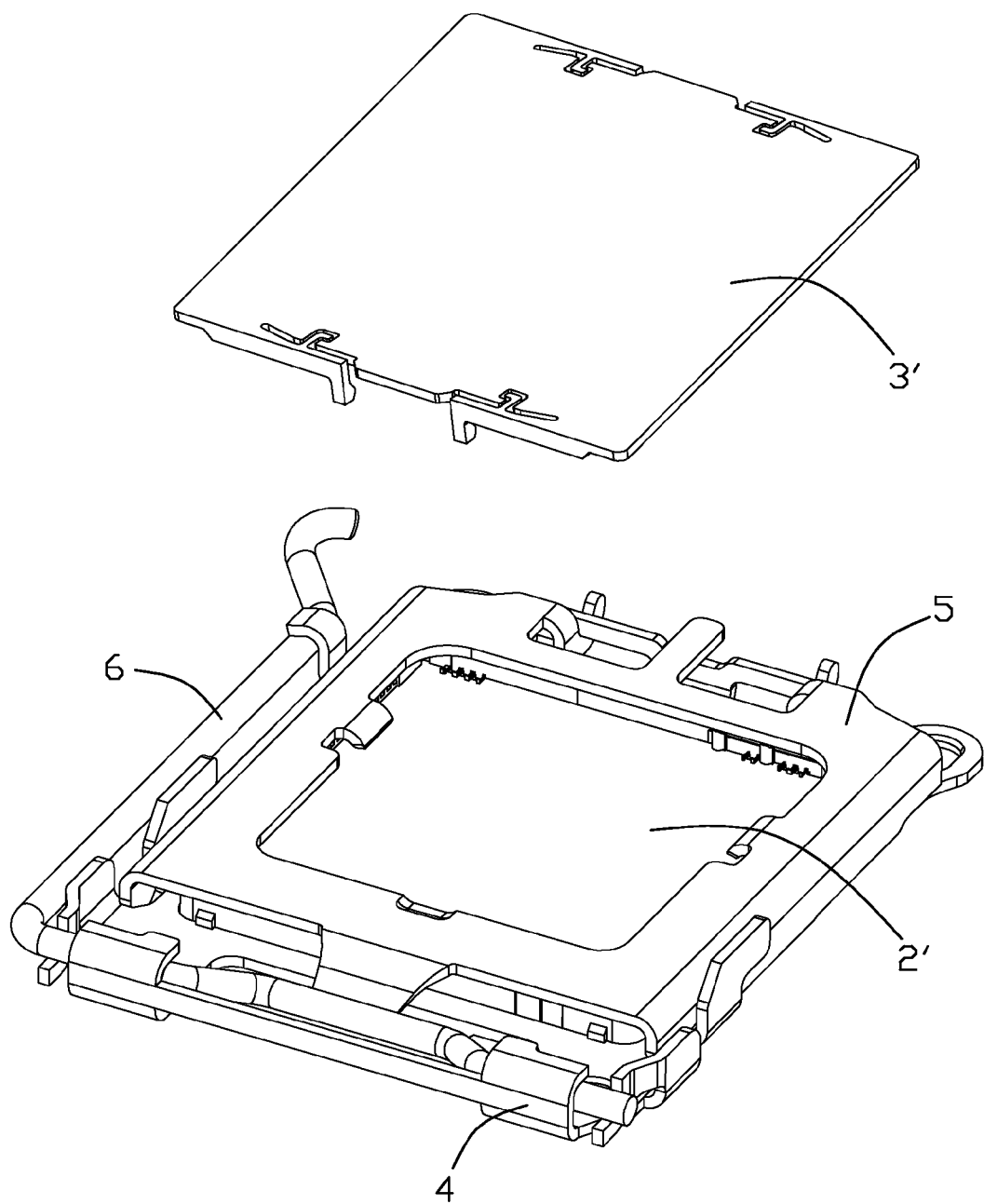
FIG. 5 is an exploded perspective view of another electrical connector assembly in according to the present invention.

FIG. 5 shows another embodiment of the present invention. In this embodiment, the electrical connector comprises a stiffener 4 around an insulative housing 2', a load plate 5 mounted to one end of the stiffener 4, a lever 6 mounted to the other end of the stiffener 4 and a pick-up cap 3'. The pick-up cap 3' is engaged with the load plate 5 and covered the top surface of the load plate 5 to avoid polluting the contacts in the insulative housing 2'.

In the present invention, the pick-up 3 is engaged with the electrical connector, but is not limited to engage with the insulative housing 2 and the load plate 5.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly, comprising:
an electrical connector having an insulative housing defining a substantially rectangular cavity in a middle thereof and a plurality of contacts received in the cavity; and
a pick-up cap assembled to the electrical connector and comprising a main portion with a planar top surface and a plurality of spring arms extending from two opposite edges of the main portion for engaging with the electrical connector, each spring arm having a locking portion for engaging with the main portion if excessive deformation of the spring arm is encountered, wherein the locking portion is formed with an L-shaped configuration and extends from a substantially middle of the lateral portion toward the main portion, wherein each spring arm comprises a lateral portion extending from the main portion and along corresponding edge of the main portion, and a latch portion extending downwardly from the lateral portion to engage with the main portion, wherein the latch portion has a protrusion extending inwardly, wherein the insulative housing has a plurality of recesses at outside walls thereof to receive and latch the protrusions of the pick-up cap, wherein the main portion has a plurality of substantially L-shaped recesses corresponding to the locking portions and engaging with the locking portions to prevent the spring arms from over expanding outwardly.

2. The electrical connector assembly as claimed in claim 1, wherein The lateral portion has two parts disposed on two sides of the locking portion, a part extending from the main portion has a gradually enhancive width to make a linking portion of the part with the main portion has a large width than the rest part thereof, so the lateral portion will not be easily break off.

3. The electrical connector assembly as claimed in claim 1, further comprising a stiffener disposed around the insulative housing and a load plate mounted to one end of the stiffener and a lever mounted to the other end of the stiffener.

4. The electrical connector assembly as claimed in claim 3, wherein the pick-up cap is engaged with the load plate and covers the top surface of the load plate.

5. An electrical connector assembly, comprising:
an electrical connector having an insulative housing defining a base and a plurality of periphery walls extending from the base;
a plurality of contacts being received in the base; and
a pick-up cap assembled to the electrical connector and comprising a main portion with a planar top surface, the pick-up cap comprising a plurality of spring arms extending from edges of the main portion for engaging with the electrical connector, each spring arm having a locking portion limited by a locking recess defined on the main portion to prevent the spring arm from over expanding, wherein the spring arms are disposed at opposite edges of the main portion and each edge has a pair of the spring arms, wherein the pair of the spring arms extend toward each other and a handle is disposed between the pair of spring arms, wherein both the locking portion and the locking recess have a L-shaped configuration, wherein each spring arm comprises a lateral portion extending from the main portion and along corresponding edge of the main portion, and a latch portion extending downwardly from the lateral portion, and wherein the locking portion is substantially disposed at the middle of the lateral portion.

* * * * *